(12) United States Patent
Degura

(10) Patent No.: US 11,154,000 B2
(45) Date of Patent: Oct. 19, 2021

(54) SUBSTRATE WORK MACHINE

(71) Applicant: FUJI CORPORATION, Chiryu (JP)

(72) Inventor: Kazuya Degura, Toyota (JP)

(73) Assignee: FUJI CORPORATION, Chiryu (JP)

( * ) Notice: Subject to any disclaimer, the term of this patent is extended or adjusted under 35 U.S.C. 154(b) by 246 days.

(21) Appl. No.: 16/316,408

(22) PCT Filed: Jul. 20, 2016

(86) PCT No.: PCT/JP2016/071257
§ 371 (c)(1),
(2) Date: Jan. 9, 2019

(87) PCT Pub. No.: WO2018/016025
PCT Pub. Date: Jan. 25, 2018

(65) Prior Publication Data
US 2019/0297759 A1 Sep. 26, 2019

(51) Int. Cl.
*H05K 13/04* (2006.01)
*H05K 13/08* (2006.01)
(Continued)

(52) U.S. Cl.
CPC .......... *H05K 13/0473* (2013.01); *B23P 21/00* (2013.01); *H01L 21/4842* (2013.01);
(Continued)

(58) Field of Classification Search
CPC . B23P 21/00; H01L 21/4842; H05K 13/0015; H05K 13/0061; H05K 13/04; H05K 13/0473
See application file for complete search history.

(56) References Cited

U.S. PATENT DOCUMENTS 4,205,433 A * 6/1980 Araki ................. H05K 13/0426
29/837
5,909,914 A * 6/1999 Imai .................... H05K 13/0473
29/837
(Continued)

FOREIGN PATENT DOCUMENTS

DE 20 2013 102 221 U1 8/2013
JP 1-293600 A 11/1989
(Continued)

OTHER PUBLICATIONS

International Search Report dated Oct. 25, 2016 in PCT/JP2016/071257 filed Jul. 20, 2016.

*Primary Examiner* — Minh N Trinh
(74) *Attorney, Agent, or Firm* — Oblon, McClelland, Maier & Neustadt, L.L.P.

(57) ABSTRACT

A component mounter includes a substrate conveying-and-holding device 22 configured to convey a board, work heads 60, 62 configured to hold a component, a work head moving device 64 configured to shift the work heads above the board, multiple work units 34, 36, 37 configured to perform work on the board from below, and a unit moving device 35 configured to shift the work units below the board, and each of the multiple work units is mounted on a mounting section of the unit moving device in an exchangeable fashion. With the substrate work machine configured as described above, the board can be worked on from above and below, hence making it possible to deal with various types of work. In addition, by exchanging the work units mounted in the mounting section, further types of work can be dealt with.

7 Claims, 17 Drawing Sheets

(51) Int. Cl.
  *B23P 21/00*    (2006.01)
  *H01L 21/48*    (2006.01)
  *H05K 3/34*     (2006.01)
  *H05K 13/00*    (2006.01)

(52) U.S. Cl.
  CPC .......... *H05K 3/34* (2013.01); *H05K 13/0015* (2013.01); *H05K 13/0061* (2013.01); *H05K 13/04* (2013.01); *H05K 13/087* (2018.08); *H05K 13/0815* (2018.08)

(56) References Cited

U.S. PATENT DOCUMENTS

| | | | |
|---|---|---|---|
| 6,609,295 B1 * | 8/2003 | Koyama | H05K 13/0473 29/832 |
| 10,178,820 B2 * | 1/2019 | Degura | G06K 7/1417 |

FOREIGN PATENT DOCUMENTS

| | | | |
|---|---|---|---|
| JP | 2015-2230 A | | 1/2015 |
| JP | 2016-18970 A | | 2/2016 |
| JP | WO2017/037949 | * | 3/2017 |

* cited by examiner

SUBSTRATE WORK MACHINE

TECHNICAL FIELD

The present application relates to a substrate work machine configured to perform work on a board while the board is conveyed in, positioned in place, and discharged from the interior of the machine.

BACKGROUND ART

A substrate work machine normally includes a conveyance device configured to convey a board and position it in a predetermined position and a shifting device configured to shift a holding head to any position above the board positioned by the conveyance device, mounting a component held by the holding head on the board. The following Patent Literature describes an example of such a substrate work machine.

PATENT LITERATURE

Patent Literature 1: JP-A-2016-18970

BRIEF DESCRIPTION

Technical Problem

With a substrate work machine described in the Patent Literature described above, although mounting work can be performed favorably, it is desirable to perform component mounting work of various types of components on a board as well as various types of work different from component mounting work. The present disclosure has been made in view of this situation, and an object of the present disclosure is to provide a substrate work machine capable of dealing with various types of work.

Solution to Problem

With a view to solving the problem, the present disclosure provides a substrate work machine for performing work on a board while the board is conveyed in, positioned in place and discharged, the substrate work machine comprising:
multiple types of work units, being provided below a conveyance height of the board, which is configured to perform work on the board from below thereof; and
a mounting section where each of the multiple types of work units is mounted in an exchangeable manner.

Advantageous Effect

The substrate work machine according to the present disclosure comprises the multiple types of work units provided below the conveyance height of the board and configured to perform work on the board from below; and the mounting section where each of the multiple types of work units is mounted in an exchangeable manner. With the substrate work machine configured as described above, the board can be worked on from above and below, hence making it possible to deal with various types of work. In addition, by exchanging the work units mounted in the mounting section, further types of work can be dealt with.

DESCRIPTION OF EMBODIMENT

Hereinafter, referring to drawings, an embodiment of the present disclosure will be described in detail as a best mode for carrying out the present disclosure.

Figure 1:
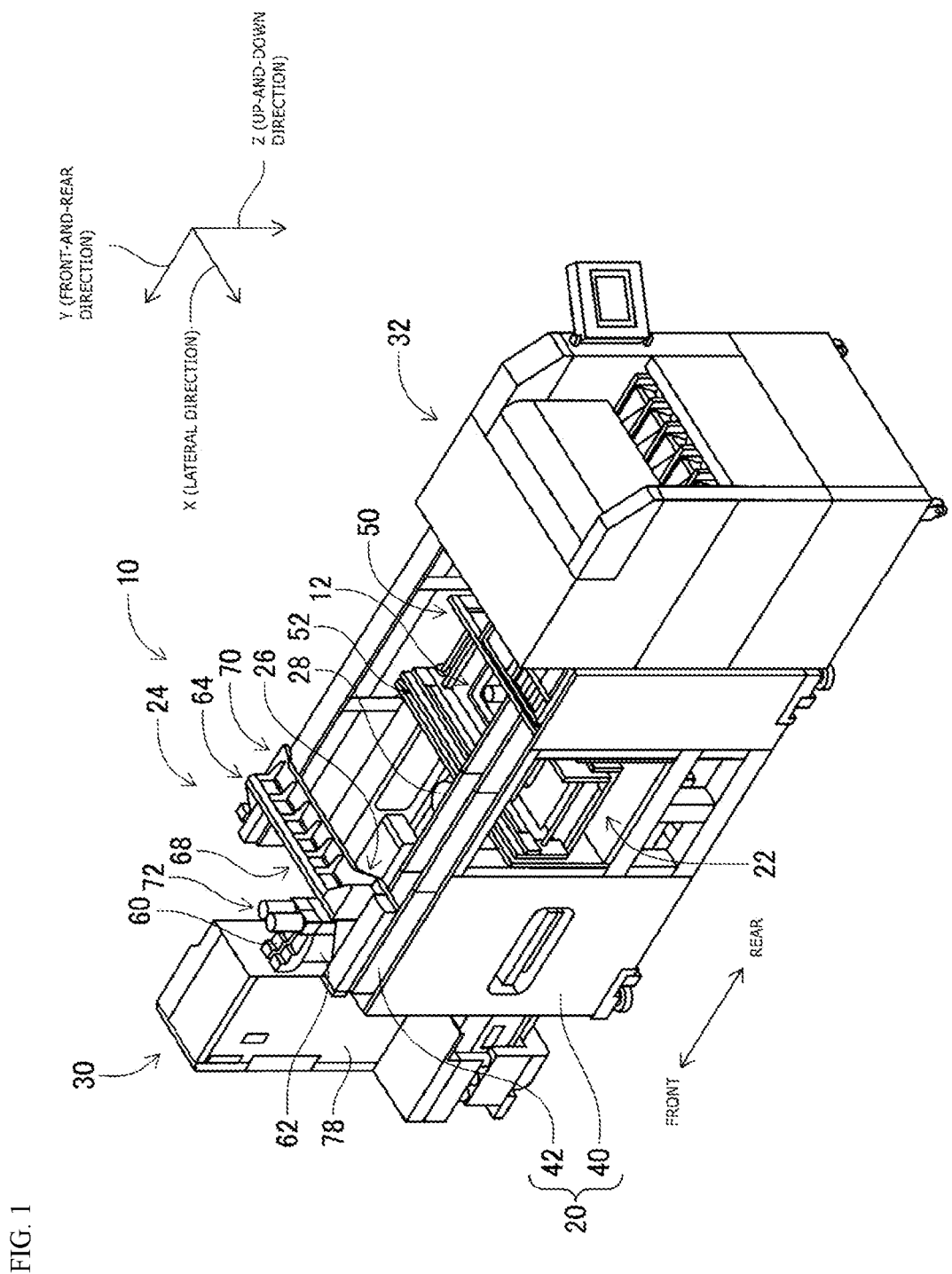
FIG. 1 is a perspective view showing a component mounting device.

FIG. 1 is a perspective view showing a configuration of component mounting device 10. Component mounting device 10 is a device configured to mount a component on circuit substrate 12. Component mounting device 10 comprises device main body 20, substrate conveying-and-holding device 22, component mounting device 24, mark camera 26, component camera 28, component supply device 30, bulk component supply device 32, first cut-and-clinch unit (refer to FIG. 4) 34, unit moving device (refer to FIG. 3) 35, second cut-and-clinch unit (refer to FIG. 11) 36, screw tightening unit (refer to FIG. 12) 37 and control device (refer to FIG. 13) 38. A circuit board, a board of a three-dimensional structure, and the like can be used as circuit substrate 12, and a printed wiring board, a printed circuit board, and the like can be used as a circuit board.

Device main body 20 is made up of frame section 40 and beam section 42 provided to extend over frame section 40. Substrate conveying-and-holding device 22 is provided at the center of frame section 40 in the front-and-rear direction thereof and has conveyance device 50 and clamping device 52. Conveyance device 50 constitutes a device configured to convey circuit substrate 12, and clamping device 52 constitutes a device configured to hold circuit substrate 12. With this configuration, substrate conveying-and-holding device 22 conveys circuit substrate 12 and holds circuit substrate 12 fixedly in a predetermined position. In the following description, the conveying direction of circuit substrate 12 is referred to as the X direction, the direction perpendicular to the X direction is referred to as the Y direction, and the vertical direction is referred to as the Z direction. That is, the width direction of component mounting device 10 is the X direction, and the front-and-rear direction of component mounting device 10 is the Y direction.

Figure 2:
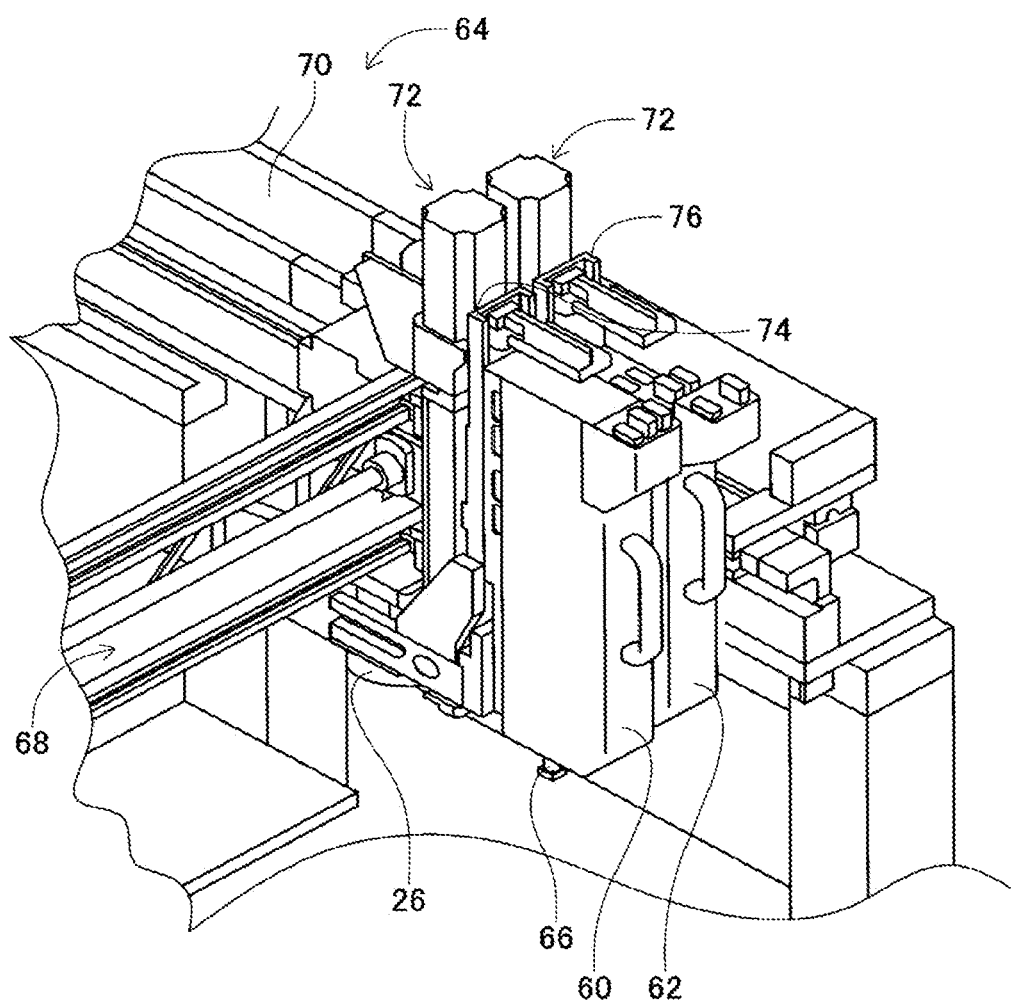
FIG. 2 is a perspective view showing a component mounting device.

Component mounting device 24 is provided at beam section 42 and has two work heads 60, 62 and work head moving device 64. As shown in FIG. 2, suction nozzle 66 is provided on a lower end face of each one of work heads 60, 62, and a component is picked up by suction nozzle 66 through suction. Work head moving device 64 has X direction shifting device 68, Y direction shifting device 70, and Z direction shifting device 72. Then, two work heads 60, 62 are shifted together to any position on frame section 40 by X direction shifting device 68 and Y direction shifting device 70. Two work heads 60, 62 are mounted detachably on sliders 74, 76, respectively, and Z direction shifting device 72 shifts sliders 74, 76 in the up-and-down direction separately. That is, work heads 60, 62 are shifted separately in the up-and-down direction by Z direction shifting device 72.

Mark camera 26 is attached to slider 74 while facing downwards as shown in FIG. 2, and is shifted in the X direction, the Y direction, and the Z direction together with work head 60. This allows mark camera 26 to capture an image of any position on frame section 40. As shown in FIG. 1, component camera 28 is provided between substrate conveying-and-holding device 22 and component supply device 30 on frame section 40 while facing upwards. This allows component camera 28 to capture images of components held onto suction nozzles 66 on work heads 60, 62.

Component supply device 30 is provided at a first end portion of frame section 40 in the front-and-rear direction. Component supply device 30 has tray-type component supply device 78 and feeder-type component supply device (refer to FIG. 13) 80. Tray-type component supply device 78 constitutes a device configured to supply components placed on a tray. Feeder-type component supply device 80 constitutes a device configured to supply components using a tape feeder or a stick feeder (not shown).

Bulk component supply device 32 is provided at a second end portion of frame section 40 in the front-and-rear direction. Bulk component supply device 32 constitutes a device configured to align multiple components loosely scattered into a line and supply the components while keeping the components aligned. That is, bulk component supply device 32 constitutes a device configured to align multiple components in any orientation into a predetermined orientation and supply the components in the predetermined orientation.

Electronic circuit components, solar cell constituent components, power module constituent components, and the like can be used as components to be supplied by component supply device 30 and bulk component supply device 32. The electronic circuit components include components having a lead, components having no lead, and the like.

Figure 4:
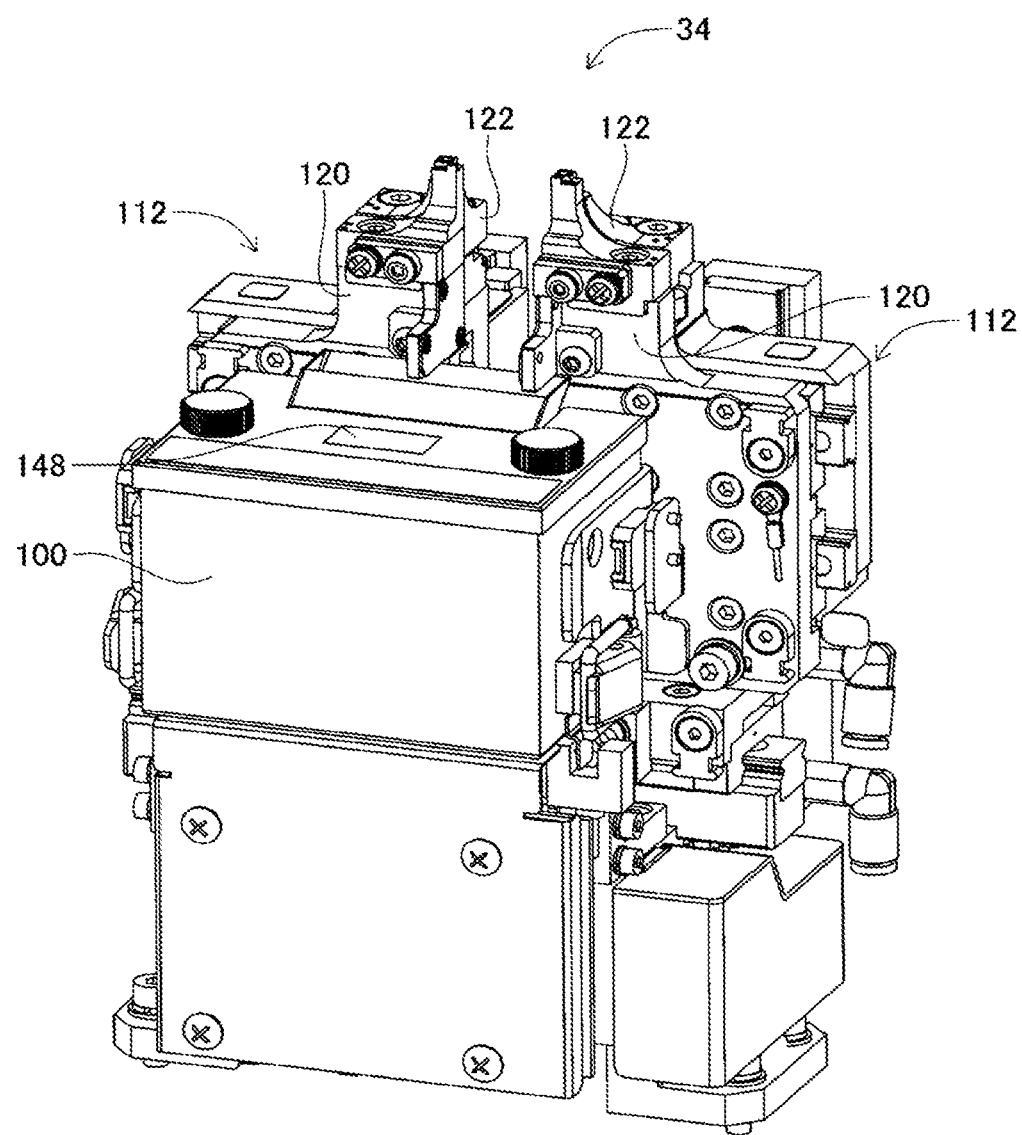
FIG. 4 is a perspective view showing the first cut-and-clinch unit.
Figure 4:
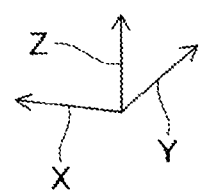
Figure 5:
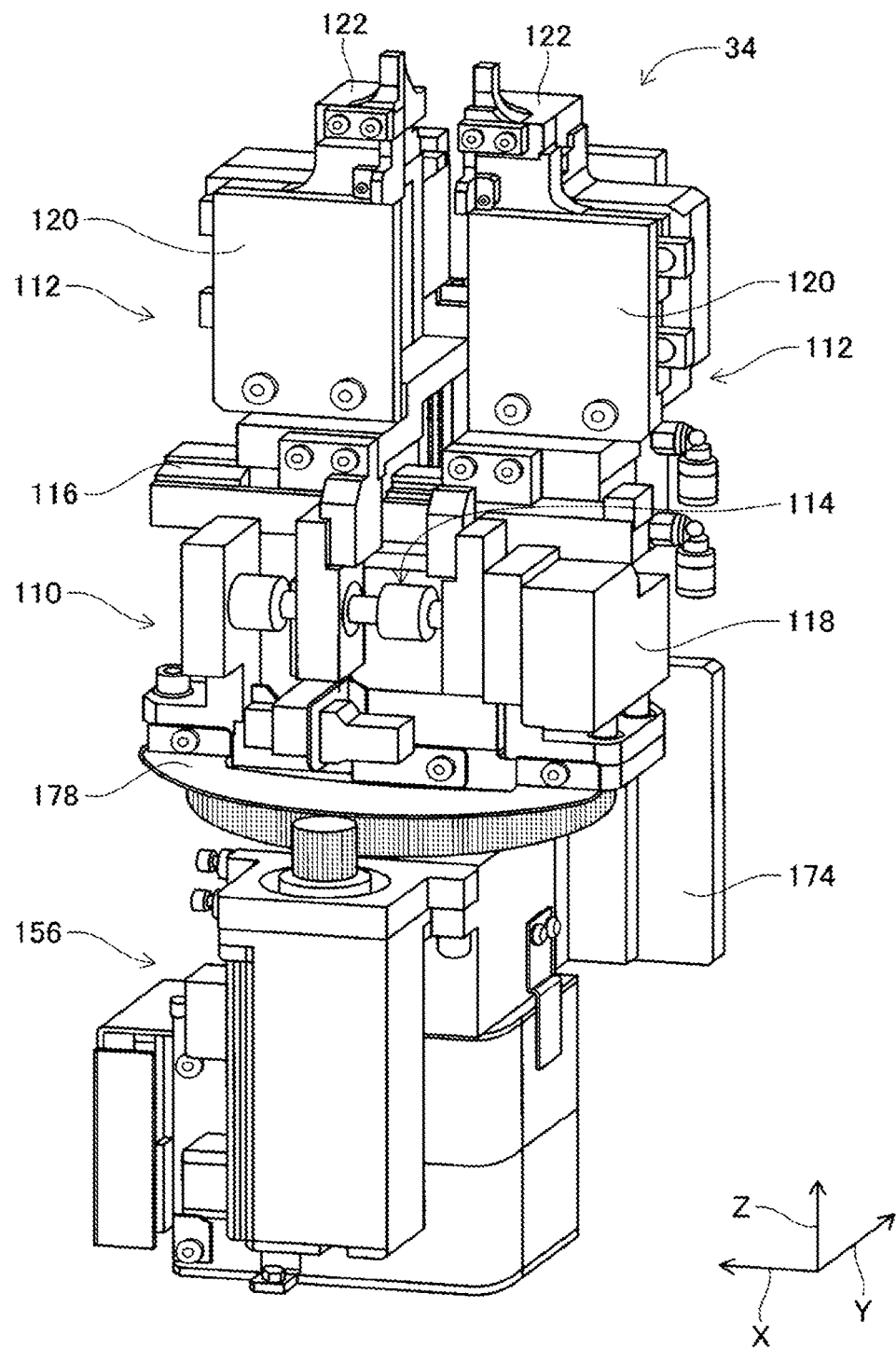
FIG. 5 is a perspective view showing the first cut-and-clinch unit with the housing removed.

First cut-and-clinch unit 34, second cut-and-clinch unit 36 and screw tightening unit 37 are mounted on unit moving device 35 in an exchangeable manner and are provided below a conveyance height of circuit substrate 12 by conveyance device 50. Firstly, referring to FIGS. 4 and 5, first cut-and-clinch unit 34 will be described. FIG. 4 is a perspective view showing first cut-and-clinch unit 34, and FIG. 5 is a perspective view showing first cut-and-clinch unit 34 with housing 100 removed.

First cut-and-clinch unit 34 constitutes a device configured to cut and bend leads (refer to FIG. 14) 108 of a lead component (refer to FIG. 14) 106 inserted into through holes (refer to FIG. 14) 104 formed in circuit substrate 12. First cut-and-clinch unit 34 includes unit main body 110, pair of slide bodies 112, and pitch change mechanism 114, as shown in FIG. 5. Slide rail 116 is provided at an upper end of unit main body 110 so as to extend in the X direction. Pair of slide bodies 112 are supported slidably by slide rail 116. This allows slide bodies 112 to move toward and away from each other in the X direction. Pitch change mechanism 114 has solenoid motor 118 and changes controllably the distance between pair of slide bodies 112 by the action of solenoid motor 118.

Figure 6:
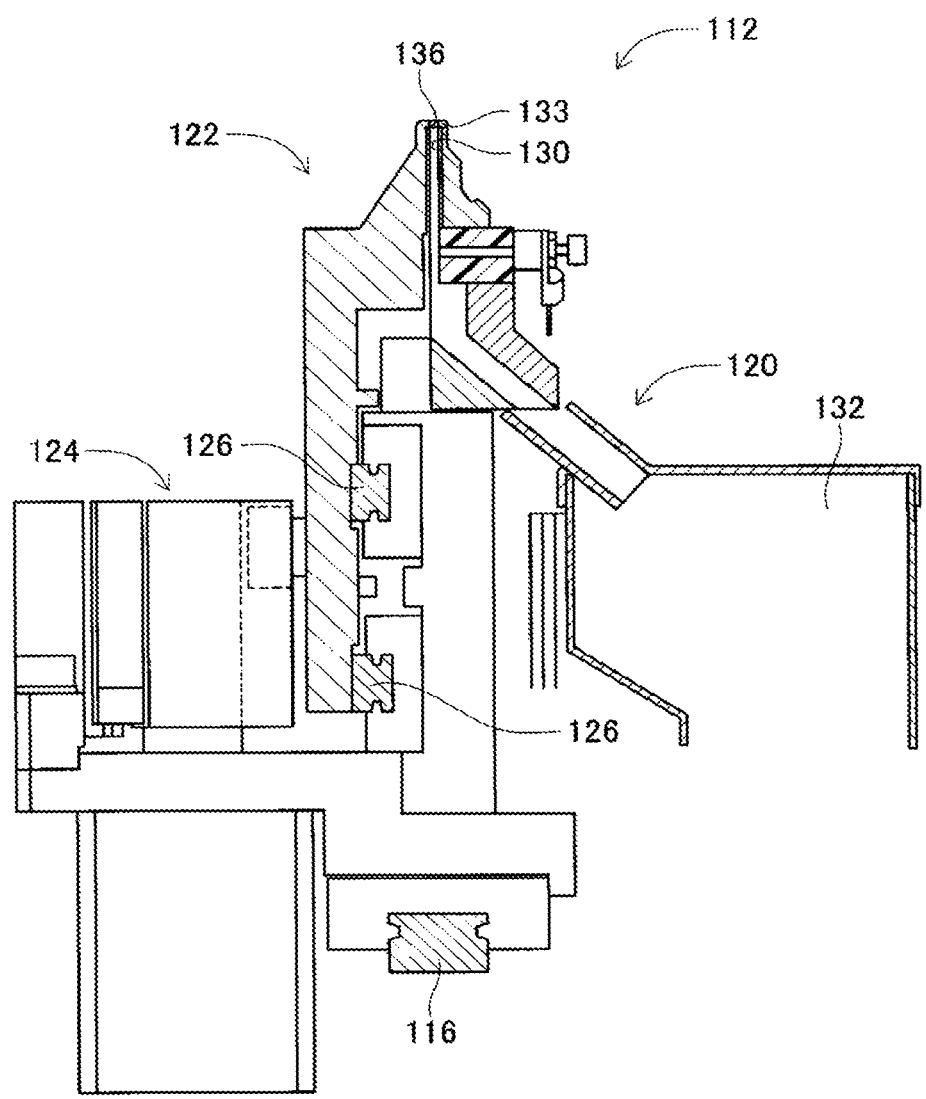
FIG. 6 is a sectional view showing a slide body.

As shown in FIG. 6, each of pair of slide bodies 112 includes fixed section 120, movable section 122, and slide device 124, and is fixed slidably by slide rail 116 at fixed section 120. Two slide rails 126 are fixed to a rear surface side of fixed section 120 so as to extend in the X direction, and movable section 122 is slidably held by two slide rails 126. This allows movable section 122 to slide relative to fixing section 120 in the X direction. Slide device 124 has solenoid motor (refer to FIG. 13) 128, and movable section 122 slides controllably by the action of solenoid motor 128.

The upper end portion of fixed section 120 is tapered, and first insertion hole 130 is formed so as to pass through the upper end portion in the up-and-down direction. First insertion hole 130 opens at an upper end face of fixing section 120 at an upper end thereof, and an opening edge to the upper end face is made into fixed blade (refer to FIG. 14) 131. First insertion hole 130 opens to a side surface of fixed section 120 at a lower end thereof, and discard box 132 is provided below an opening to the side surface.

Figure 7:
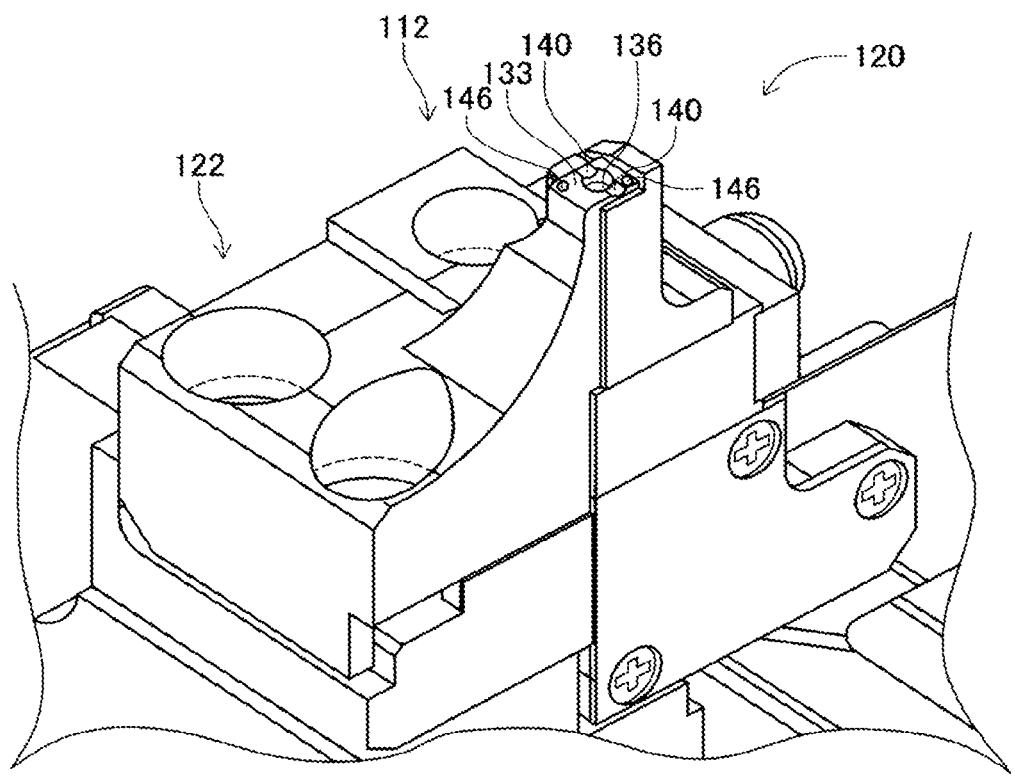
FIG. 7 is an enlarged view showing the slide body.

As shown in FIG. 7, an upper end portion of movable section 122 is also tapered, and bent portion 133, which is bent into an L-shape, is formed at the upper end portion. Bent portion 133 extends over the upper end face of fixed section 120, and bent portion 133 faces an upper end of fixed section 120 with a slight clearance provided therebetween. First insertion hole 130 opening at the upper end face of fixed section 120 is covered by bent portion 133, but second insertion hole 136 is formed in bent portion 133 so as to face first insertion hole 130.

Second insertion hole 136 constitutes a through hole that passes through bent portion 133 in the up-and-down direction, and an inner circumferential surface of second insertion hole 136 is tapered to gradually reduce the inside diameter of second insertion hole 136 as it extends downwards. Further, an opening edge of second insertion hole 136 to a lower end face of bent portion 133 is made into movable blade (refer to FIG. 14) 138. Guide groove 140 is formed on an upper end face of bent portion 133 so as to extend in the X direction, that is, in the sliding direction of movable section 122. Guide groove 140 is formed so as to straddle the opening of second insertion hole 136, and guide groove 140 and second insertion hole 136 connect to each other. Then, guide groove 140 opens to both side surfaces of bent portion 133. Further, pair of marks 146 are provided on the upper end face of bent portion 133. Pair of marks 146 are provided symmetrically with respect to the center of the opening of second insertion hole 136 as the center. That is, the central point between pair of marks 146 constitutes the center of the opening of second insertion hole 136.

Figure 3:
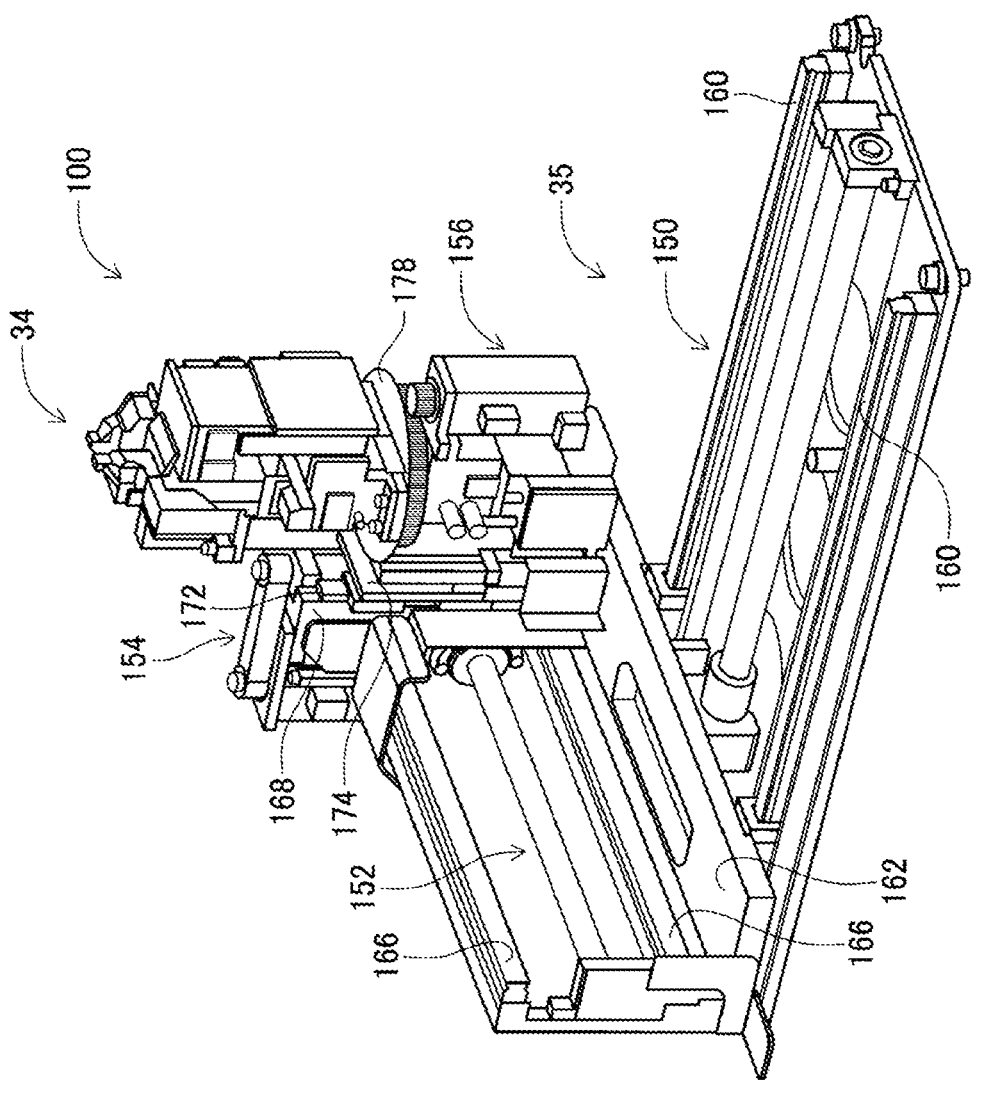
FIG. 3 is a perspective view showing a first cut-and-clinch unit and a unit moving device.

Unit moving device 35 has X-direction shifting device 150, Y-direction shifting device 152, Z-direction shifting device 154, and turn device 156, as shown in FIG. 3. X-direction shifting device 150 includes slide rail 160 and X slider 162. Slide rail 160 is provided so as to extend in the X direction, and X slider 162 is held slidably on slide rail 160. Then, X slider 162 shift in the X direction by being driven by solenoid motor (refer to FIG. 13) 164. Y-direction shifting device 152 includes slide rail 166 and Y slider 168. Slide rail 166 is provided on X slider 162 so as to extend in the Y direction, and Y slider 168 is held slidably on slide rail 166. Then, Y slider 168 shifts in the Y direction by being driven by solenoid motor (refer to FIG. 13) 170. Z-direction shifting device 154 includes slide rail 172 and Z slider 174. Slide rail 172 is provided on Y slider 168 so as to extend in the Z direction, and Z slider 174 is held slidably on slide rail 172. Then, Z slider 174 shifts in the Z direction by being driven by solenoid motor (refer to FIG. 13) 176.

Turn device 156 has rotary table 178 having a substantially circular disc shape. Rotary table 178 is supported by Z slider 174 so as to turn about its axial center and turns by being driven by solenoid motor (refer to FIG. 13) 180. Then, first cut-and-clinch unit 34 is detachably mounted on an upper surface of rotary table 178.

Figure 8:
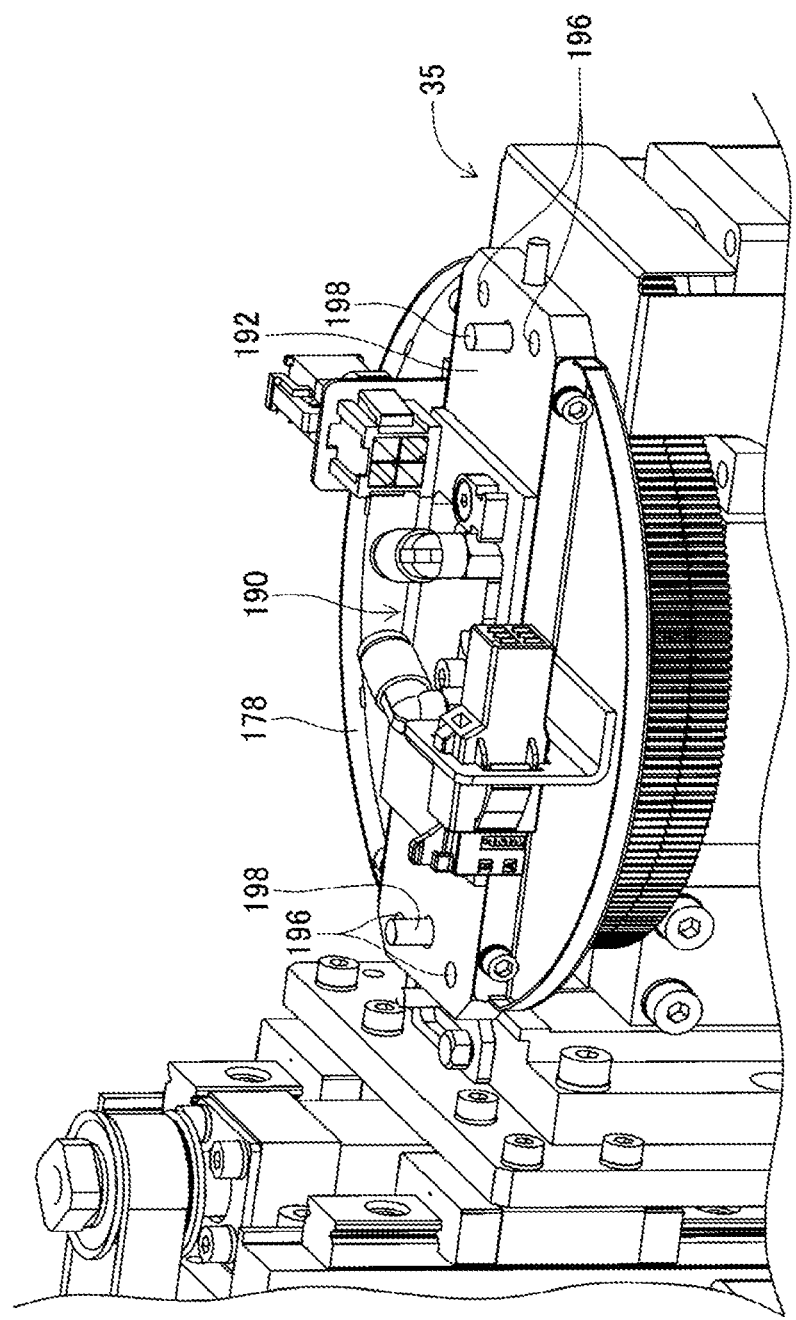
FIG. 8 is an enlarged view of a mounting section.

Specifically, as shown in FIG. 8, mounting section 190 is provided on the upper surface of rotary table 178 to mount detachably first cut-and-clinch unit 34. Mounting section 190 has placing table 192 having a substantially rectangular shape, and placing table 192 is fixed to the upper surface of rotary table 178. Pair of bolt holes 196 and erected pin 198 erected between pair of bolt holes 196 are provided at both longitudinal end portions of placing table 192.

Figure 9:
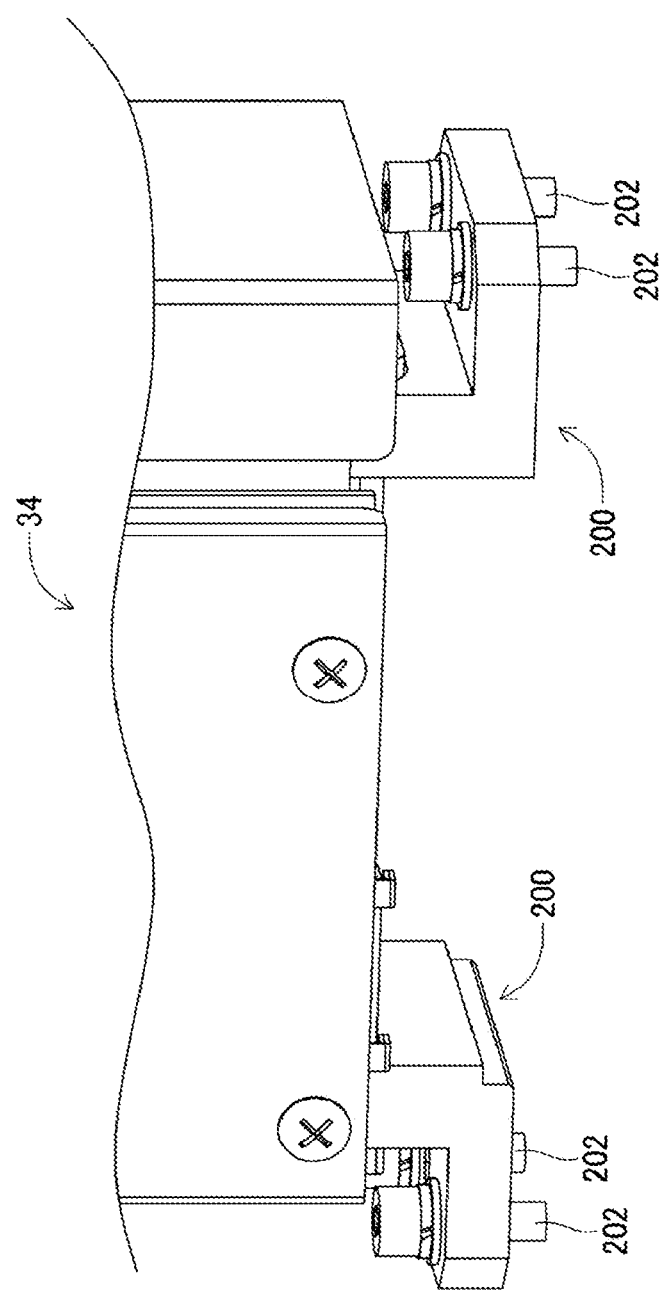
FIG. 9 is an enlarged view of leg sections.
Figure 10:
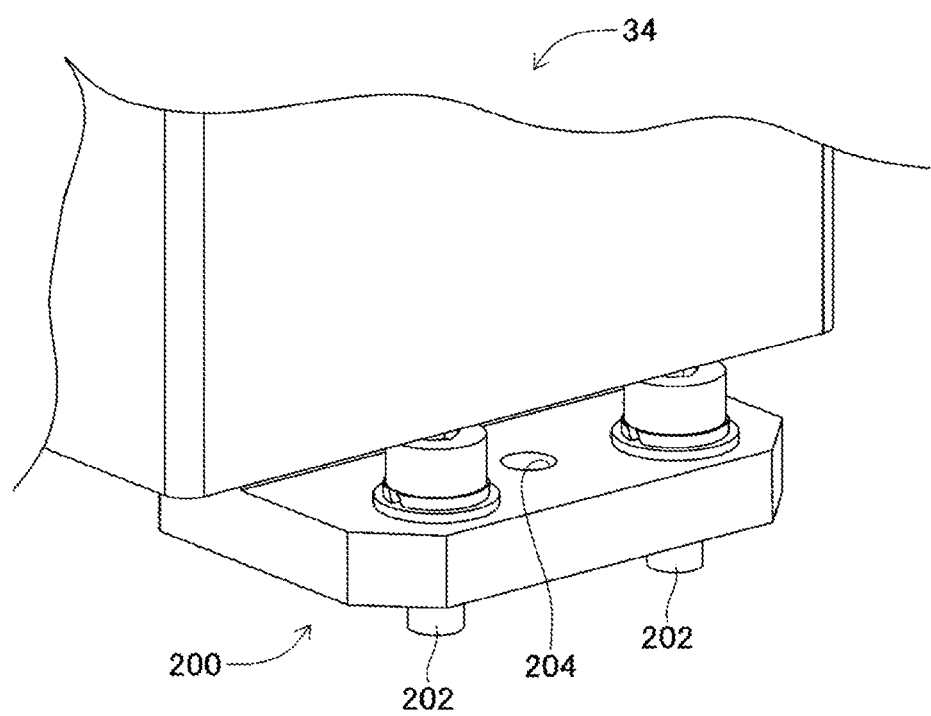
FIG. 10 is an enlarged view of the leg section.

On the other hand, as shown in FIG. 9, pair of leg sections 200 are provided on a lower surface of first cut-and-clinch unit 34. Pair of bolts 202 are provided on each leg section 200 so as to be fastened in place in pair of bolt holes 196 formed in mounting section 190. Further, as shown in FIG. 10, fitting hole 204 is formed between pair of bolts 202 on each leg section 200 so that erected pin 198 formed on mounting section 190 can fit in. Then, first cut-and-clinch unit 34 is placed on the upper surface of rotary table 178 so that erected pins 198 of mounting section 190 fit in fitting holes 204 of leg sections 200 of first cut-and-clinch unit 34, and bolts 202 are fastened in place in bolt holes 196, whereby first cut-and-clinch unit 34 is fixed to the upper surface of rotary table 178. By doing so, first cut-and-clinch unit 34 shifts to any position below circuit substrate 12 held by clamping device 52 by the operation of unit moving device 35 and turns to any angle. Then, in first cut-and-clinch unit 34, the fastening of bolts 202 in bolt holes 196 is released, and erected pins 198 are removed from fitting holes 204, whereby first cut-and-clinch unit 34 is removed from rotary table 178. By adopting this configuration, first cut-and-clinch unit 34 can be attached detachably to unit moving device 35.

As shown in FIG. 4, 2D code 148 is provided on an upper surface of housing 100 of first cut-and-clinch unit 34. A specific code of first cut-and-clinch unit 34 is written on 2D code 148, a unit mounted on unit moving device 35 is identified as first cut-and-clinch unit 34 by reading 2D code 148.

Figure 11:
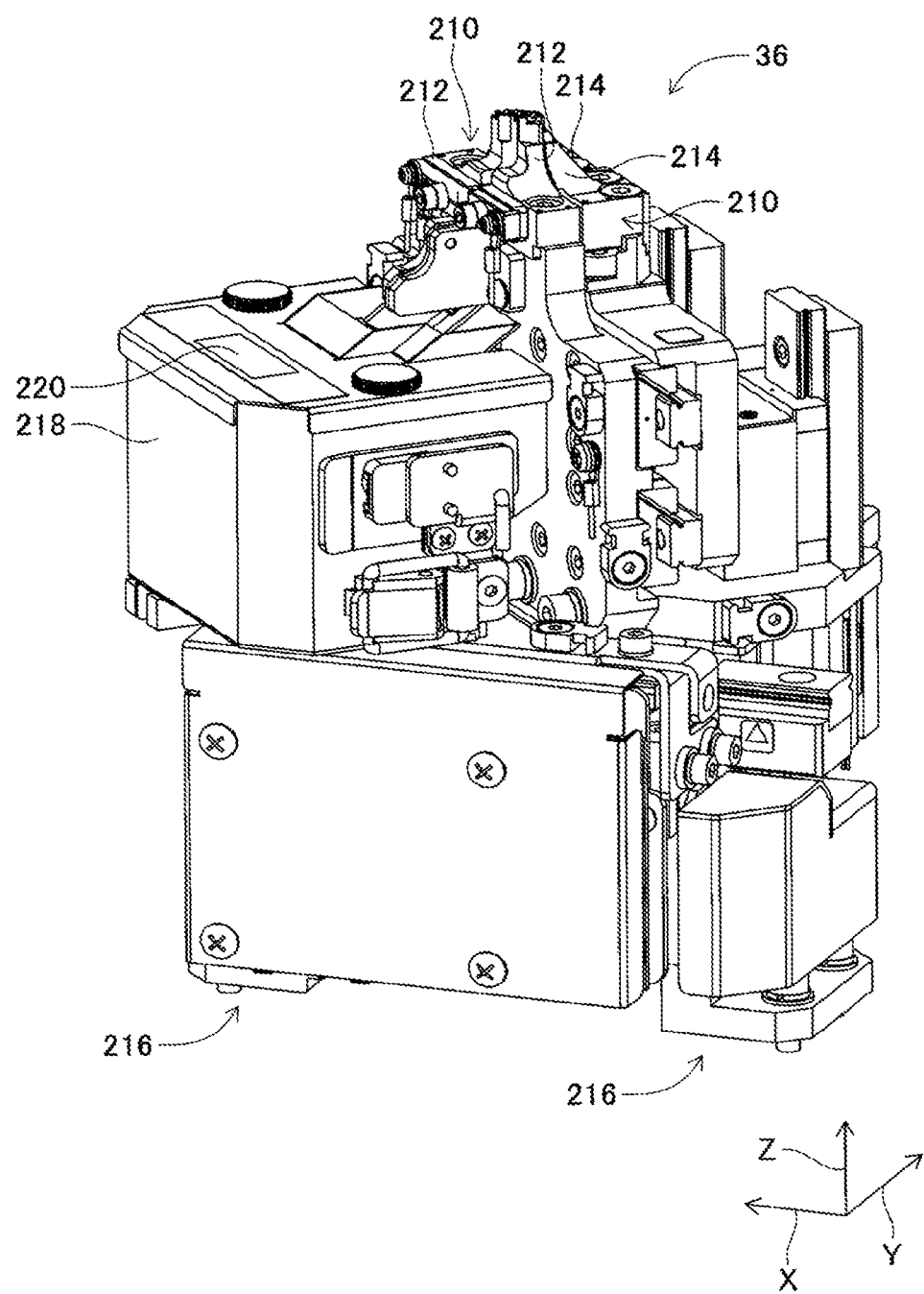
FIG. 11 is a perspective view showing a second cut-and-clinch unit.

As shown in FIG. 11, second cut-and-clinch unit 36 has pair of slide bodies 210. Since slide bodies 210 of second cut-and-clinch unit 36 have substantially the same structure as that of slide bodies 112 of first cut-and-clinch unit 34, only different configurations from slide bodies 112 will be described.

As with slide main bodies 112 of first cut-and-clinch unit 34, slide bodies 210 of second cut-and-clinch unit 36 are each made up of fixing section 212 and movable section 214. Fixed section 212 and movable section 214 of second cut-and-clinch unit 36 are configured in the same manner as fixed section 120 and movable section 122 of first cut-and-clinch unit 34, and hence, movable section 214 can slide relative to fixed section 212. In first cut-and-clinch unit 34, however, movable section 122 slides in the X direction, but in second cut-and-clinch unit 36, movable section 214 slides in a direction that is inclined about 45 degrees from the X direction towards the Y direction.

Pair of slide bodies 210 of second cut-and-clinch unit 36 slides in the Y direction in such a manner as to move towards and away from each other in the same way as pair of slide bodies 112 of first cut-and-clinch unit 34. That is, in first cut-and-clinch unit 34, the sliding direction of pair of slide bodies 112 coincides with the sliding direction of movable section 122 relative to fixing section 120, but in second cut-and-clinch unit 36, the sliding direction of pair of slide bodies 210 deviates 45 degrees with respect to the sliding direction of movable section 214 relative to fixing section 212 on an XY-plane. Only in this respect, first cut-and-clinch unit 34 differs from second cut-and-clinch unit 36.

Pair of leg sections 216, having the same structure as that of pair of leg sections 200 of first cut-and-clinch unit 34, are provided on a lower surface of second cut-and-clinch unit 36. Due to this, first cut-and-clinch unit 34 is removed from rotary table 178, and second cut-and-clinch unit 36 can be mounted on rotary table 178 in place of first cut-and-clinch unit 34.

As with first cut-and-clinch unit 34, 2D code 220 is also provided on an upper surface of housing 218 of second cut-and-clinch unit 36. A code specific to second cut-and-clinch unit 36 is written on 2D code 220, whereby a unit mounted on rotary table 178, that is, unit moving device 35 is identified as second cut-and-clinch unit 36 by reading 2D code 220.

Figure 12:
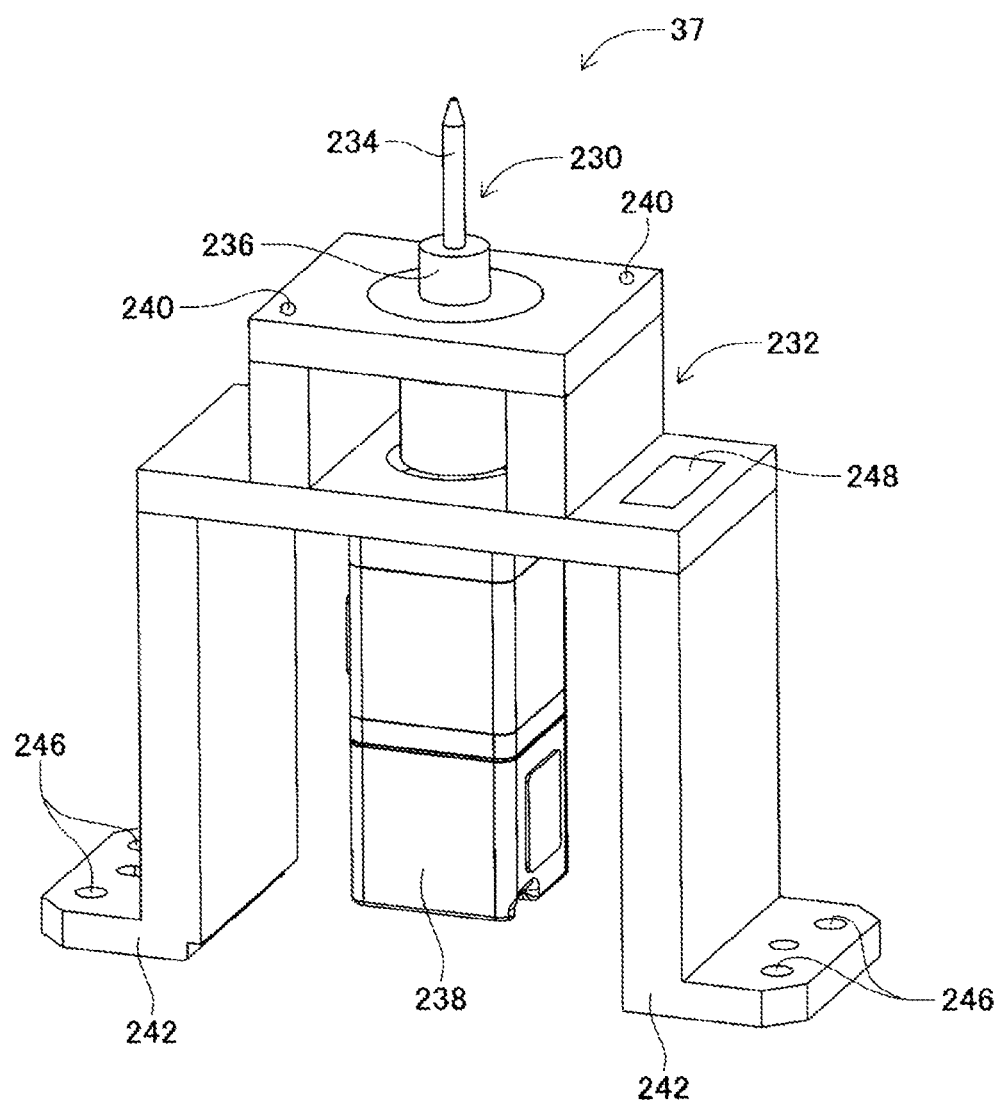
FIG. 12 is a perspective view showing a screw tightening unit.

As shown in FIG. 12, screw tightening unit 37 has screw tightening device 230 and unit main body 232. Screw tightening device 230 is made up of driver shaft 234, holding mechanism 236, and solenoid motor 238. Driver shaft 234 is held by holding mechanism 236 so as to turn on its own axial center and turns controllably by being driven by solenoid motor 238. Screw tightening device 230 is held fixedly by unit main body 232 so that driver shaft 234 extends in the up-and-down direction, and driver shaft 234 extends upwards from an upper surface of unit main body 232. Pair of marks 240 are provided on the upper unit main body 232 from which driver shaft 234 extends upwards. Pair of marks 240 are provided symmetrically with respect to the center axis of driver shaft 234 as the center.

Unit main body 232 has pair of leg sections 242, and pair of leg sections 242 have substantially the same structure as those of pair of leg sections 200 of first cut-and-clinch unit 34 and pair of leg sections 216 of second cut-and-clinch unit 36. In FIG. 12, on each leg section 242, bolts configured to be fastened in bolt hole 196 on rotary table 178 is omitted, and through holes 246 are shown through which the bolts are passed. By adopting this configuration, first cut-and-clinch unit 34 or second cut-and-clinch unit 36 is removed from rotary table 178, and screw tightening unit 37 can be mounted on rotary table 178 in place of first cut-and-clinch unit 34 or second cut-and-clinch unit 36.

As with first cut-and-clinch unit 34 and second cut-and-clinch unit 36, 2D code 248 is also provided on an upper surface of unit main body 232 of screw tightening unit 37. A code specific to screw tightening unit 37 is written on 2D code 248, and a unit mounted on rotary table 178, that is, unit moving device 35 is identified as screw tightening unit 37 by reading 2D code 248.

Figure 13:
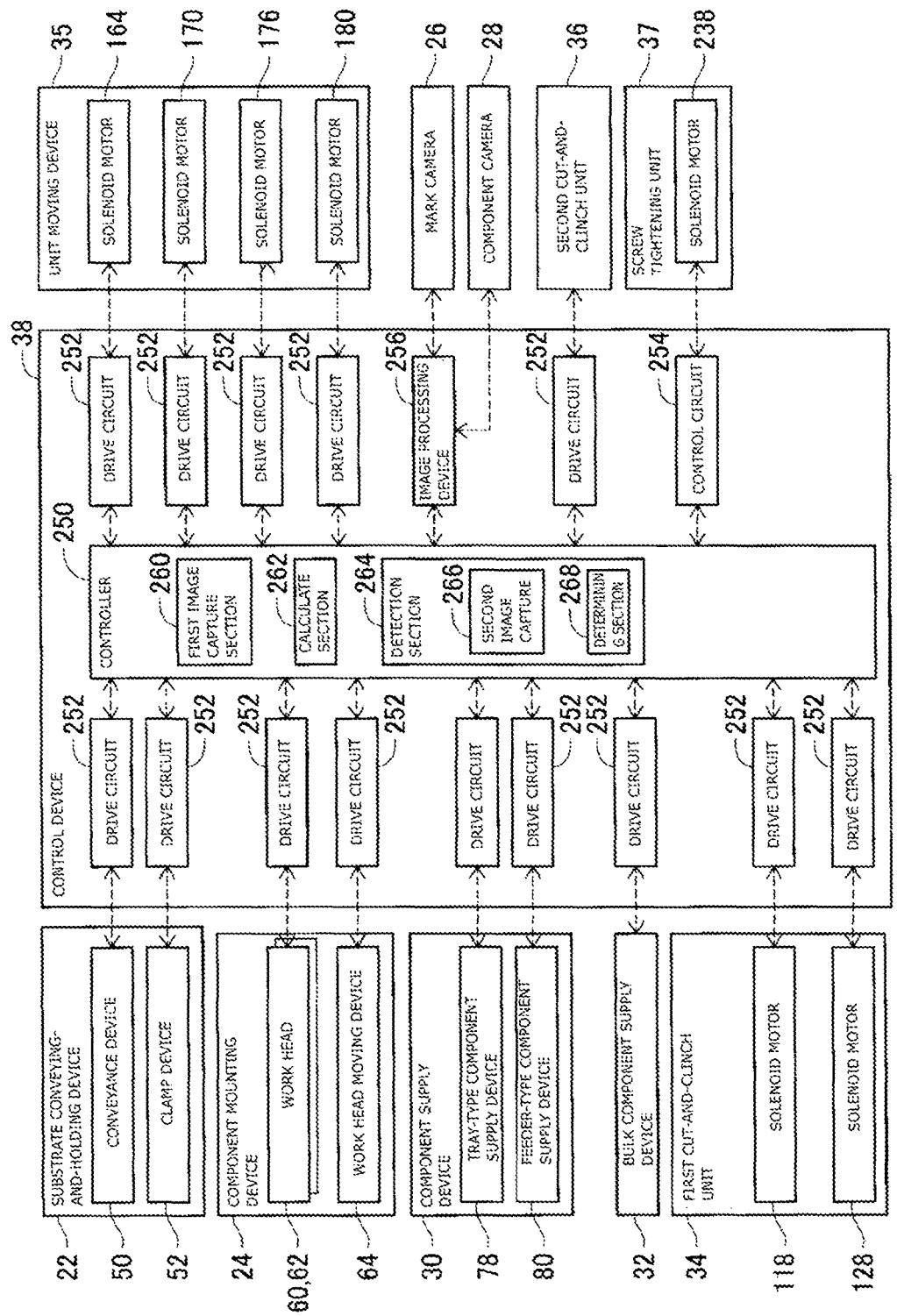
FIG. 13 is a block diagram showing a control device.

As shown in FIG. 13, control device 38 includes controller 250, multiple drive circuits 252, and image processing device 256. Multiple drive circuits 252 are connected to conveyance device 50, clamp device 52, work heads 60, 62, work head moving device 64, tray-type component supply device 78, feeder-type component supply device 80, bulk component supply device 32, and solenoid motors 118, 128, 164, 170, 176, 180, 238. Controller 250 includes a CPU, ROM, RAM and the like, and is made up mainly of a computer, connecting to multiple drive circuits 252. As a result, substrate conveying-and-holding device 22, component mounting device 24 and the like are controlled by controller 250. Controller 250 also connects to image processing device 256. Image processing device 256 processes image data obtained by mark camera 26 and component camera 28, and controller 250 acquires various types of information from the image data.

[Operation of Component Mounter]

In component mounting device 10, with the configuration that has been described heretofore, various types of work are performed on circuit substrate 12 held by substrate conveying-and-holding device 22. Specifically, for example, with first cut-and-clinch unit 34 mounted on rotary table 178, leads 108 of lead component 106 are inserted into through holes 104 formed in circuit substrate 12 to be clinched in a direction in which leads 108 move toward each other or in a direction in which leads 108 move away from each other, whereby lead component 106 is mounted on circuit substrate 12. Hereinafter, mounting work of lead component 106 by use of first cut-and-clinch unit 34 will be described.

Firstly, first cut-and-clinch unit 34 is mounted on rotary table 178 of unit moving device 35. Then, circuit substrate 12 is conveyed to a working position by substrate conveying-and-holding device 22 and is then held fixedly in the working position. Next, mark camera 26 shifts to a position lying above circuit substrate 12 and captures an image of circuit substrate 12. Then, information on a holding position of circuit substrate 12 and the like is calculated based on the data of the captured image. Component supply device 30 or bulk component supply device 32 supplies lead component 106 in a predetermined supply position. Then, either of work heads 60, 62 shifts to a position lying above the component supply position and picks up and holds a component main body section (refer to FIG. 14) 260 of lead component 106 by suction nozzle 66 through suction.

Subsequently, work heads 60, 62 holding lead component 106 shift above component camera 28, so that an image of lead component 106 held by suction nozzle 66 is captured by component camera 28. Then, information on the holding position of the component and the like is calculated based on the data on the captured image. Next, when component camera 28 completes capturing the image of lead component 106, work heads 60, 62 holding lead component 106 shift above circuit substrate 12 and correct the error of the holding position of circuit substrate 12 and the error of the holding position of the component. Then, leads 108 of lead component 106 held suction nozzle 66 are inserted into through holes 104 formed in circuit substrate 12. As this occurs, first cut-and-clinch unit 34 is shifted below circuit substrate 12.

Specifically, a distance between pair of slide bodies 112 is controlled by pitch change mechanism 114 so that the distance between second insertion holes 136 of movable sections 122 of pair of slide bodies 112 becomes equal to the distance between two through holes 104 formed in circuit substrate 12 in first circuit substrate 34. Then, X-direction shifting device 150 and Y-direction shifting device 152 operate to shift first cut-and-clinch unit 34 in such a way that X and Y coordinates of second insertion holes 136 in slide bodies 112 coincide with X and Y coordinates of through holes 104 in circuit substrate 12. That is, when first cut-and-clinch unit 34 is shifted along the X and Y directions, second through holes 136 of slide bodies 112 are placed below through holes 104 of circuit substrate 12 so that they coincide with each other in the up-and-down direction.

Next, Z-direction shifting device 154 operates to raise first cut-and-clinch unit 34 in such a way that upper surfaces of movable sections 122 come into contact with a lower surface of circuit substrate 12 or are positioned slightly below the lower surface of circuit substrate 12. In this way, first cut-and-clinch unit 34 is disposed below circuit substrate 12 with through holes 104 of circuit substrate 12 superposed on second insertion holes 136 of slide bodies 112 by controlling the operations of X-direction shifting device 150, Y-direction shifting device 152, and Z-direction shifting device 154.

Figure 14:
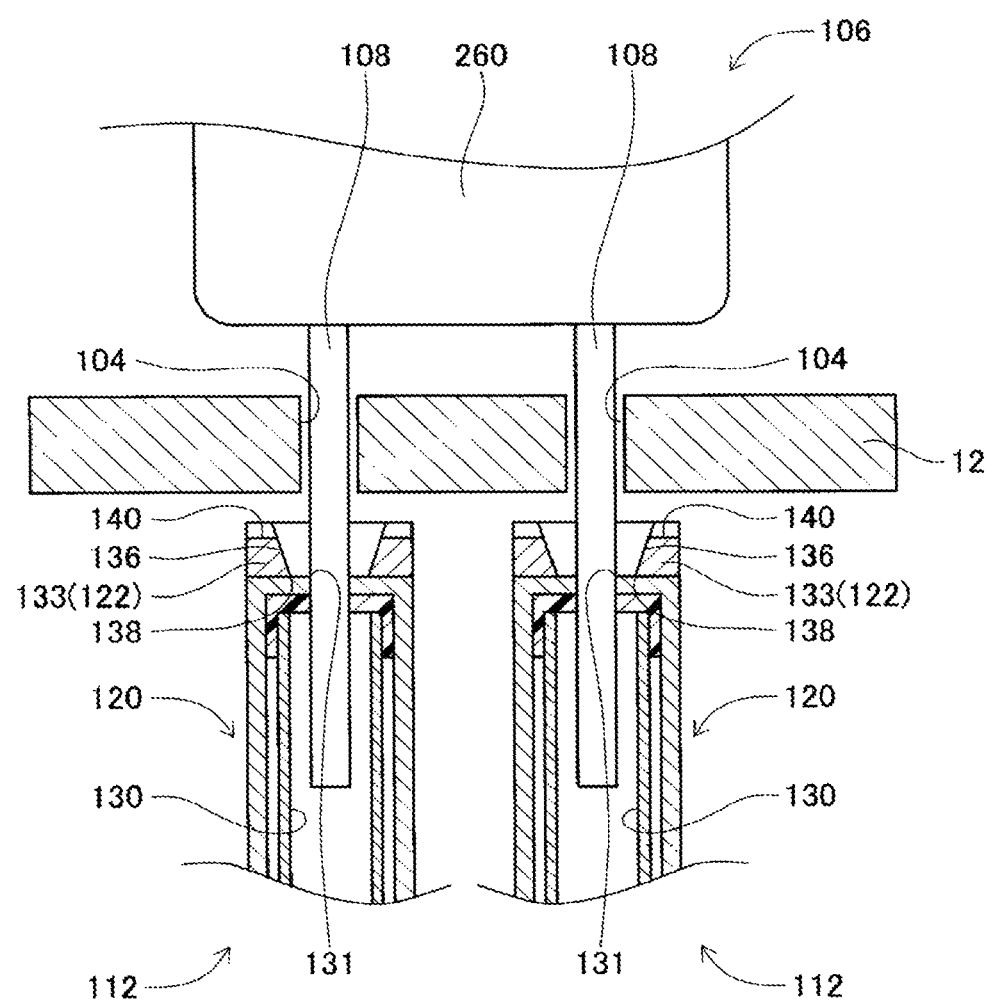
FIG. 14 is a schematic diagram showing the first cut-and-clinch unit cutting and bending leads of a lead component.
Figure 15:
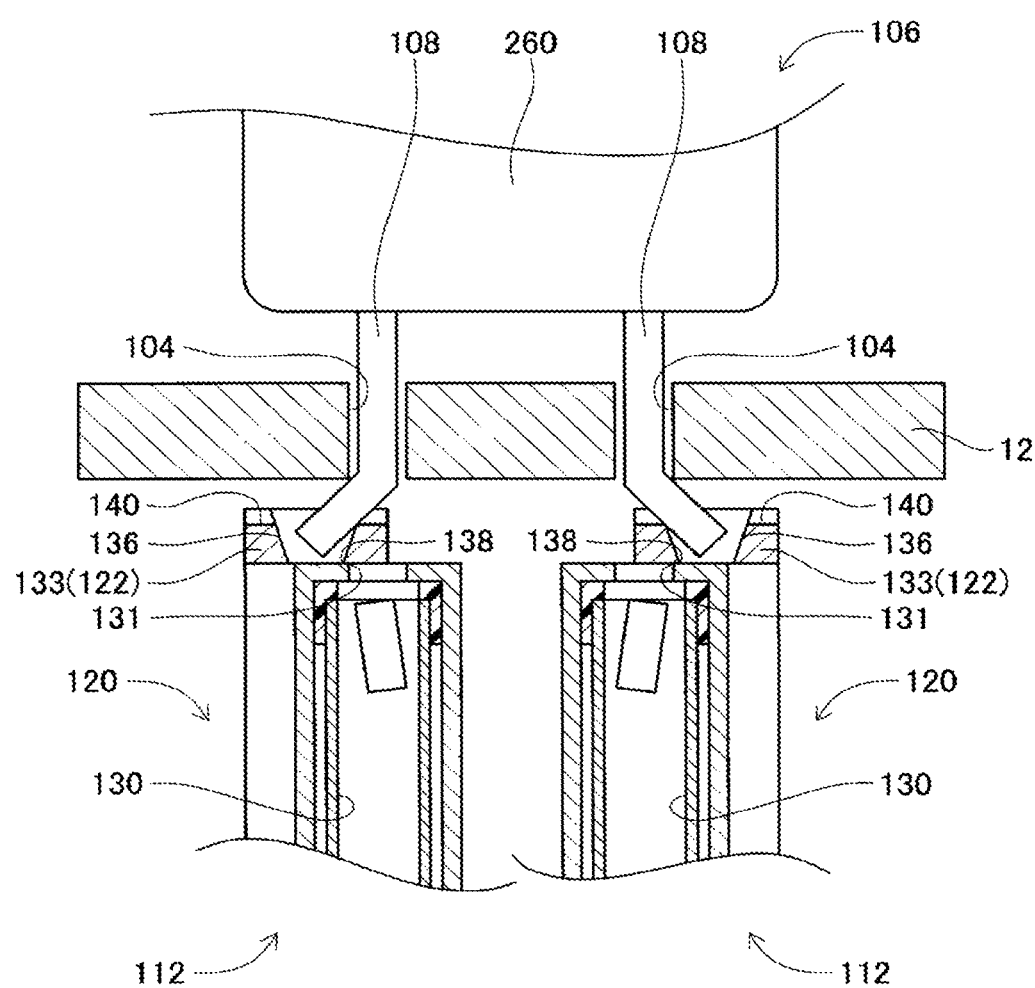
FIG. 15 is a schematic diagram showing the first cut-and-clinch unit cutting and bending leads of a lead component.

Then, when leads 108 of lead component 106 held by suction nozzle 66 are inserted into through holes 104 of circuit substrate 12, distal end portions of leads 108 are inserted into first insertion holes 130 of fixed sections 120 via second insertion holes 136 of movable sections 122 of first cut-and-clinch unit 34, as shown in FIG. 14. Following this, when leads 108 are inserted into first insertion holes 130 via second insertion holes 136, movable sections 122 of pair of slide bodies 112 slide in directions in which they move away from each other. As a result, as shown in FIG. 15, leads 108 are cut by fixed blades 131 of first insertion holes 130 and movable blades 138 of second insertion holes 136. Then, the distal end portions of leads 108 that are cut as a result of leads 108 being cut fall in interiors of first insertion holes 130 for disposal into discard box 132.

In addition, pair of movable sections 122 continue to slide in the directions in which they move away from each other even after leads 108 have been cut. Due to this, new distal end portions of leads 108 that result from the previous cutting of the distal end portions are bent along the tapered inner circumferential surfaces of second insertion holes 136 as movable sections 122 slide, and as movable sections 122 slide further, the distal end portions of leads 108 are bent along guide grooves 140. Movable sections 122 slide along the direction in which pair of leads 108 are aligned. As a result, lead component 106 is mounted on circuit substrate 12 with pair of leads 108 bent so as to move away from each other in the direction in which pair leads 108 are aligned (hereinafter, referred to as an "outwardly bent state" from time to time), whereby leads 108 are prevented from being dislocated from through holes 104.

Figure 16:
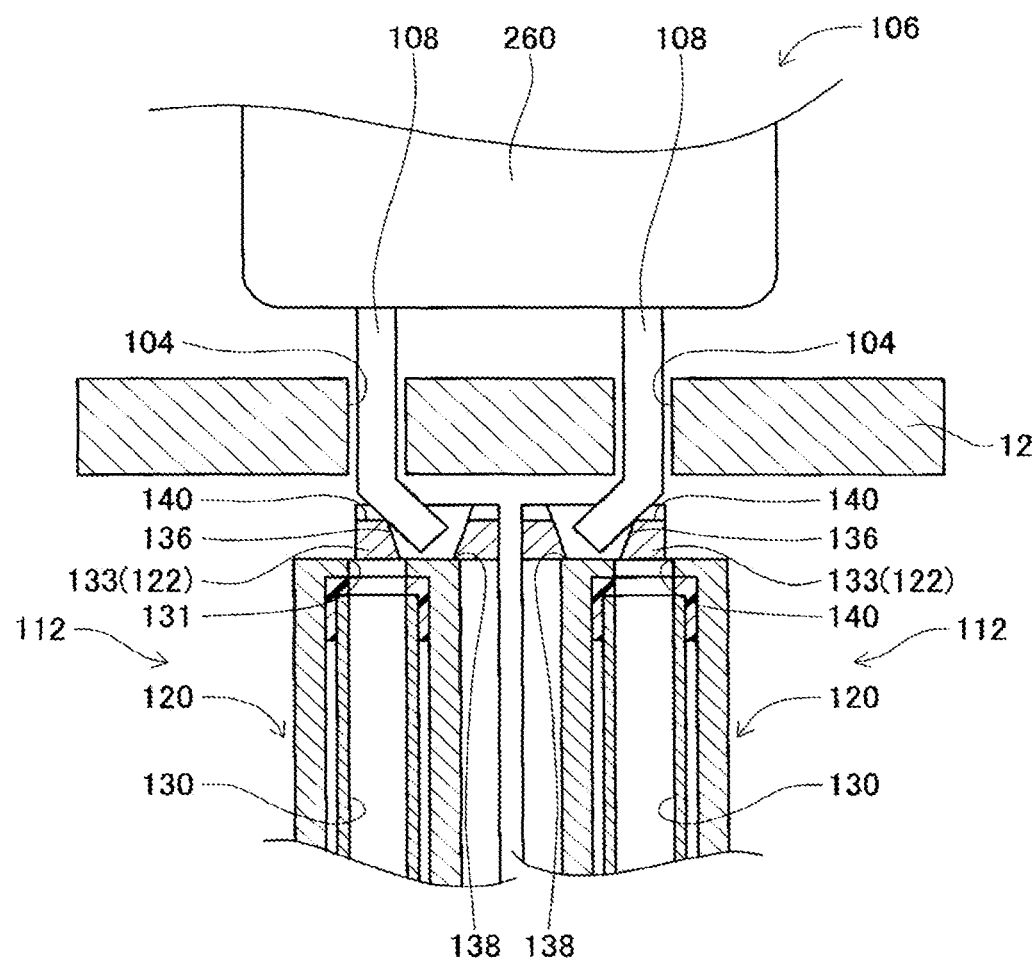
FIG. 16 is a schematic diagram showing the first cut-and-clinch unit cutting and bending leads of a lead component.

In addition, by using first cut-and-clinch unit 34, lead component 106 can be mounted on circuit substrate 12 not in the outwardly bent state but in such a state that pair of leads 108 are bent so as to move towards each other in the direction in which pair of leads 108 are aligned (hereinafter, referred to as an "inwardly bent state" from time to time). To be specific, movable sections 122 of pair of slide bodies 112 are caused to slide in directions in which they move towards each other after leads 108 are inserted into first insertion holes 130 via second insertion holes 136. By doing so, as shown in FIG. 16, leads 108 are cut by fixed blades 131 of first insertion holes 130 and movable blades 138 of second insertion holes 136. Then, pair of leads 108 are bent in the directions in which they move towards each other by causing pair of movable sections 122 to slide further in the directions in which they move towards each other. As a result, lead component 106 is mounted on circuit substrate 12 in the inwardly bent state. In this way, lead component 106 is mounted on circuit substrate 12 in the outwardly bent state or the inwardly bent state by mounting first cut-and-clinch unit 34 on rotary table 178.

In component mounting device 10, by mounting second cut-and-clinch unit 36 on rotary table 178 in place of first cut-and-clinch unit 34, lead component 106 is mounted on circuit substrate 12 in such a state that pair of leads 108 are bent in a generally N-shape (hereinafter, referred to as an "N-shaped bent state").

To be specific, firstly, second cut-and-clinch unit 36 is mounted on rotary table 178 of unit moving device 35. Then, in second cut-and-clinch unit 36, too, as with first cut-and-clinch unit 34, second insertion holes 136 of slide bodies 210 are placed below through holes 104 of circuit substrate 12 so that they coincide with each other in the up-down direction by controlling the operation of unit moving device 35. Subsequently, leads 108 of lead component 106 held by suction nozzle 66 are inserted into first insertion holes 130 of fixed portions 212 through second insertion holes 136 of movable sections 214 by inserting the leads 108 into through holes 104. Then, movable sections 214 of pair of slide bodies 210 are caused to slide in directions in which they move away from each other. As this occurs, as described above the direction in which movable sections 214 slide coincides with the direction in which pair of slide bodies 210 slide, that is, movable sections 214 slides in the direction that deviates 45 degrees with the direction in which pair of through holes 104 are aligned on the XY plane. Due to this, pair of leads 108 are bent in the direction that deviates 45 degrees with respect to the direction in which pair of through holes 104 are aligned on the XY plane. As a result, pair of leads 108 are bent generally in the N-shape, whereby lead component 106 is mounted on circuit substrate 12 in the N-shaped bent state. As a result of lead component 106 being mounted on circuit substrate 12 with pair of leads 108 staying in the N-shaped bent state, a tensile force is generated in a different direction from the direction in which lead component 106 is aligned, whereby loosening of lead component 106 is prevented.

In addition, in component mounting device 10, a relatively large component such as a case can be fixed to circuit substrate 12 through screwing by mounting screw tightening unit 37 on rotary table 178 in place of first cut-and-clinch unit 34 and second cut-and-clinch unit 36.

To be specific, firstly, screw tightening unit 37 is mounted on rotary table 178 of unit moving device 35. The operator temporarily fixes a component such as a case in a predetermined position on circuit substrate 12 outside component mounting device 10 through temporary screwing. Then, circuit substrate 12 is conveyed into an interior of component mounting device 10 with a surface of circuit substrate 12 on which the component is temporarily fixed facing downwards, and circuit substrate 12 is held in a predetermined position by clam device 52. Subsequently, X-direction shifting device 150 and Y-direction shifting device 152 are controlled to operate so that a distal end position of driver shaft 234 of screw tightening unit 37 coincides with a screwing position where the component is temporarily fixed in the up-and-down direction. Next, Z-direction shifting device 154 is controlled to operate so that a distal end of driver shaft 234 fits in a cross groove or the like formed on a head of a screw, and screw tightening unit 37 is raised. Then, solenoid motor 238 operates to turn driver shat 234 on its own axis, whereby the screw is tightened properly so that the component is fixed to circuit substrate 12.

In this way, in component mounting device 10, lead component 106 can be mounted on circuit substrate 12 in the inwardly bent state or the outwardly bent state by mounting first cut-and-clinch unit 34 on rotary table 178, lead component 106 can be mounted on circuit substrate 12 in the N-shaped bent state by mounting second cut-and-clinch unit 36 on rotary table 178, and a relatively large component can be screwed to circuit substrate 12 by mounting screw tightening unit 37 on rotary table 178. This makes it possible to perform various types of work in component mounting device 10.

Further, for example, more various types of work can be performed by preparing various types of units that can be mounted on rotary table 178. Specifically, units for various types of work can be adopted which include, for example, a unit configured to apply point flow soldering to leads of a lead component, a unit configured to hold any object, and a unit configured to inspect a board. As a point flow soldering unit, a unit can be adopted in which a small amount of molten solder is constantly jetted to the outside from a nozzle port having a small diameter of a point flow jet nozzle, and molten solder jetted from a discharge port disposed on the periphery of the jet nozzle is recovered. As a board inspection, for example, a unit can be adopted in which an image of a board is captured, and the board is inspected based on the data of captured image, or a unit can be adopted in which a board is inspected based on a detection value of a sensor or the like.

When first cut-and-clinch unit 34 or second cut-and-clinch unit 36 is mounted on rotary table 178, leads 108 of lead component 106 are inserted into smaller second insertion holes 136. When screw tightening unit 37 is mounted on rotary table 178, the distal end of driver shaft 234 is fitted in a groove such as a cross groove formed in the head of a screw. Due to this, when these units are mounted on rotary table 178, the positions of second insertion holes 136, the position of the distal end of driver shaft 234 and the like need to be recognized as required. Due to this, when those units are mounted on rotary table 178, erected pins 198 of mounting section 190 are fitted in fitting holes 204 formed in leg sections 200 or the like of the units, whereby the units can be positioned properly, this allowing the units to be mounted on rotary table 178 with good repeatability. However, due to loosening of erected pins 198 in interiors of fitting holes 204 or the like, there is a risk of the mounting position of the units on to rotary table 178 deviating slightly from the preset position. In view of such a risk, the marks are provided on each unit, and when an exchange of one of the units mounted on rotary table 178 with another of the units outside rotary table 178 is detected, images of the marks on the unit now mounted on rotary table 178 are captured, and a calibration is carried out based on the data of captured images To be specific, when an exchange of one of the units mounted on rotary table 178 with another of the units outside rotary table 178 is detected, an image of the unit now mounted on rotary table 178 is captured by mark camera 26. For example, when first cut-and-clinch unit 34 is mounted on rotary table 178, pair of marks 146 are recognized based on the data of captured images. Pair of marks 146 are provided symmetrically with respect to the center of the opening of second insertion hole 136 as the center. That is, the central point between pair of marks 146 constitutes the center of the opening of second insertion hole 136. Therefore, a center point of pair of marks 146 is calculated by recognizing the positions of pair of marks 146 based on the data of captured images, and the position of the calculated center point is recognized as an opening position of second insertion hole 136. The mounting position of first cut-and-clinch unit 34 is calibrated based on the opening position of second insertion hole 136.

When first cut-and-clinch unit 34 is mounted on rotary table 178, leads 108 of lead component 106 held by work head 60, 62 are inserted into second insertion holes 136. That is, the work is carried out in corporation of work head 60, 62 with first cut-and-clinch unit 34. Due to this, the mounting position of first cut-and-clinch unit 34 is calibrated, and a relative position of work head 60, 62 to first cut-and-clinch unit 34 is calculated. This enables leads 108 of lead component 106 to be inserted into through holes 104 as required with first cut-and-clinch unit 34 mounted on rotary table 178.

For example, with screw tightening unit 37 mounted on rotary table 178, pair of marks 240 are recognized based on the data of captured images. Pair of marks 240 are provided symmetrically with respect to the center axis of driver shaft 234 as the center. That is, a central point between pair of marks 240 constitutes a center axis of driver shaft 234. Due to this, the center point of pair of marks 240 is calculated by recognizing the positions of pair of marks 240 based on the data of captured images, and the center point so calculated is recognized as the center axis of driver shaft 234. Then, the mounting position of screw tightening unit 37 is calibrated based on the position of the center axis of driver shaft 234. By doing so, with screw tightening unit 37 mounted on rotary table 178, the distal end of driver shaft 234 can be fitted in the groove such as the cross groove formed on the head of a screw as required.

An exchange of one of the units mounted on rotary table 178 with another of the units outside rotary table 178 is detected based the 2D codes provided on these units. To be specific, an image of the unit now mounted on rotary table 178 is captured by mark camera 26 before work is performed by use of the unit mounted on rotary table 178. For example, when first cut-and-clinch unit 34 is mounted on rotary table 178, 2D code 148 is recognized based on the data of captured image. Since 2D code 148 is made as a code specific to first cut-and-clinch unit 34, the unit mounted on rotary table 178 is identified as first cut-and-clinch unit 34 based on recognized 2D code 148. Then, the designation of the identified unit is stored in control device 38. In this way, the unit mounted on rotary table 178 is identified every time work is performed by use of the unit mounted on rotary table 178, and the designation of the identified unit is stored. As this occurs, in the case where the unit identified based on the 2D code differs from the unit whose designation is stored in control device 38, it is detected that the exchanged unit is now mounted on rotary table 178.

As shown in FIG. 13, controller 250 of control device 38 has first image capture section 260, calculate section 262, and detect section 264. First image capture section 260 constitutes a function section configured to capture images of the marks provided on the unit mounted on rotary table 178. Calculate section 262 constitutes a function section configured to calculate a relative position between work heads 60, 62 and the unit mounted on rotary table 178 based on the data of captured images of the marks. Detection section 264 constitutes a function section configured to detect whether the unit now mounted on turn able 178 is the one that has just been exchanged. In addition, detection section 264 has second image capture section 266 and determine section 268. Second image capture section 266 constitutes a function section configured to capture an image of the 2D code on the unit mounted on rotary table 178. Determining section 268 constitutes a function section configured to determine whether the unit now mounted on rotary table 178 is the one that has just been exchanged based on the data of captured image of the 2D code.

Component mounting device 10 constitutes an example of a substrate work machine. Substrate conveying-and-holding device 22 constitutes an example of a conveyance device. Mark camera 26 constitutes an example of an image capture device. Component supply device 30 and bulk component supply device 32 constitute an example of a supply device. First cut-and-clinch unit 34 constitutes an example of a work unit. Unit moving device 35 constitutes an example of a downward shifting device. Second cut-and-clinch unit 36 constitutes an example of a work unit. Screw tightening unit 37 constitutes an example of a work unit. Control device 38 constitutes an example of a control device. Work heads 60, 62 constitute an example of a holding head. Work head moving device 64 constitutes an example of an upward shifting device. Mark 146 constitutes an example of a characteristic section. 2D code 148 constitutes an example of an identifier. Mounting section 190 constitutes an example of a mounting section. Placing table 192 constitutes an example of a placing table. Erected pin 198 constitutes an example of a positioning pin. Fitting hole 204 constitutes an example of a hole portion. 2D code 220 constitutes an example of an identifier. Mark 240 constitutes an example of a characteristic section. 2D code 248 constitutes an example of an identifier. First image capture section 260 constitutes an example of first image capture section. Calculate section 262 constitutes an example of a calculate section. Detection section 264 constitutes an example of a detect section. Second image capture section 266 constitutes an example of second image capture section. Determining section 268 constitutes an example of a determine section.

The present disclosure is not limited to the embodiment that has been described heretofore and hence can be carried out in various forms resulting from modifying or improving the embodiment variously based on the knowledge of those skilled in the art. Specifically, for example, in the embodiment described above, in detecting the exchange of one of the units mounted on rotary table 178 with another of the units outside rotary table 178, the image of the 2D code is captured, and the data of captured image is made use of; however, the exchange of the units may be detected by other methods. Specifically, for example, each unit stores in a storage section thereof identification information for identifying the type of each unit. Then, when one of the units is mounted on rotary table 178, the unit is connected electrically with control device 38, and the identification information stored in the storage section is transmitted from the storage section to control device 38. As this occurs, control unit 38 that receives the identification information may be configured to identify the type of the unit mounted on rotary table 178 based on the received identification information to detect an exchange of the units. The function section that acquires the identification information from the unit constitutes an example of an acquire section, and the function section that detects an exchange of the units by identifying the type of the unit mounted on rotary table 178 constitutes an example of the discrimination section. The discrimination section can discriminate at least one of discriminations of discrimination on the type of the unit mounted on rotary table 178 or discrimination on the exchange of the units.

Figure 17:
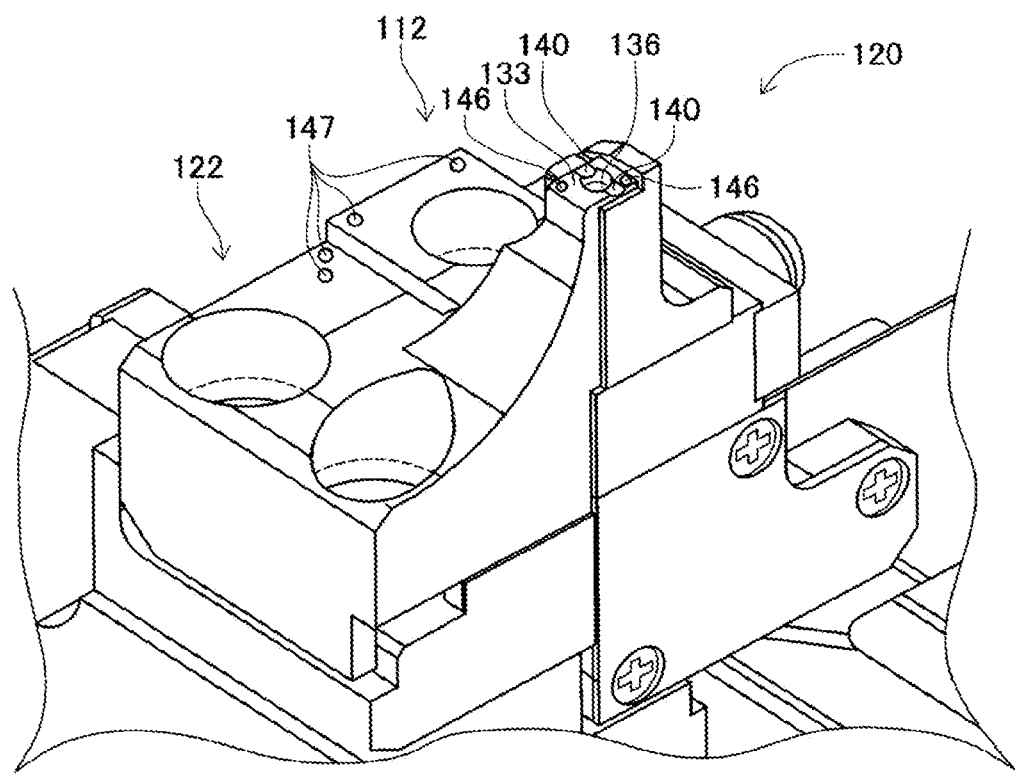
FIG. 17 is a drawing showing a mark used as an identifier.

In the embodiment, marks 146, 240 function as characteristic sections; however, 2D codes, signs and the like can be adopted as characteristic sections. In the embodiment, 2D code 148 functions as an identifier; however, a mark, sign and the like can be adopted as an identifier. FIG. 17 shows an example where marks 147 are used as identifiers. Positional patterns of marks 147 differ from unit to unit, and a unit can be identified as a result of second image capture section 266 identifying the specific positional pattern of marks 147 to the unit.

REFERENCE SIGNS LIST

10: component mounting machine (substrate work machine);
22: substrate conveying-and-holding device (conveyance device);
26: mark camera (image capture device);
30 component supply device (supply device);
32 bulk component supply device (supply device);
34 first cut-and-clinch unit (work unit);
35: unit moving device (downward shifting device);
36: second cut-and-clinch unit; (work unit);
37 screw tightening unit (work unit);
38: control device;
60: work head (holding head);
62: work head (holding head);
64: work head moving device (upward shifting device);
146: mark (characteristic section);
147: mark (identifier);
148 2D code (identifier);
190: mounting section;
192: placing table;
198: erected pin (positioning pin);
204: mark (characteristic section);
220: 2D code (identifier);
240: mark (characteristic section);
248: 2D code (identifier);
260: first image capture section;
262: calculate section;
264: detect section;
26: second image capture section;
268: determine section.

The invention claimed is:

1. A substrate work machine for performing work on a board while the board is conveyed in, positioned in place and discharged, the substrate work machine comprising:
    a conveyance device configured to convey the board and position the board in a predetermined position;
    multiple work units, each configured to perform work on the board from below the board held by the conveyance device;
    a mounting section configured to mount in an exchangeable manner one of the multiple work units to perform the work on the board from below;
    a unit moving device configured to move the mounting section in three axes to position the one of the multiple work units at a predetermined position below the board held by the conveyance device; and
    a control device, including
        an acquire section configured to acquire identification information from a storage section of a work unit of the multiple work units mounted on the mounting section, the identification information identifying a type of the work unit; and
        a discrimination section configured to discriminate at least one of a discrimination on exchange of one of the work units mounted on the mounting section with another of the work units outside the mounting section and a discrimination on a type of the work unit mounted on the mounting section based on the identification information acquired by the acquire section.

2. The substrate work machine according to claim 1, wherein each of the multiple work units performs any of bending a lead of a lead component, applying a point flow soldering to the lead of the lead component, tightening a screw, inspecting a board, and holding an object.

3. A substrate work machine for performing work on a board while the board is conveyed in, positioned in place and discharged, the substrate work machine comprising:
    a conveyance device configured to convey the board and position the board in a predetermined position;
    multiple work units, each configured to perform work on the board from below the board held by the conveyance device;
    a mounting section configured to mount in an exchangeable manner one of the multiple work units to perform the work on the board from below;
    a unit moving device configured to move the mounting section in three axes to position the one of the multiple work units at a predetermined position below the board held by the conveyance device;
    a supply device configured to supply a component to be mounted on the board;
    a holding head configured to hold the component supplied from the supply device and to mount the component on the board;
    an image capture device configured to capture an image of an upper surface of the board positioned by the conveyance device;
    a holding head moving device configured to move the holding head and the image capture device to any position above the board positioned by the conveyance device;
    a control device including a detect section configured to detect an exchange of one of the work units mounted on the mounting section with another of the work units outside the mounting section;
    a first image capture section configured to capture an image of a characteristic section provided on the work unit mounted on the mounting section by the image capture device when the detect section detects an exchange of the work units; and
    a calculate section configured to calculate a relative position between the work unit mounted on the mounting section and the holding head based on the image captured by the first image capture section.

4. The substrate work machine according to claim 3, wherein
    each of the multiple work units comprises an identifier provided on each respective work unit to identify a type of the work unit, and
    the detect section includes
        a second image capture section configured to capture an image of an identifier provided on the work unit mounted on the mounting section by the image capture device; and
        a determine section configured to identify the type of the work unit mounted on the mounting section based on the image captured by the second image capture section to determine whether the work unit mounted on the mounting section is the one that has just been exchanged.

5. A substrate work machine for performing work on a board while the board is conveyed in, positioned in place and discharged, the substrate work machine comprising:
    a conveyance device configured to convey the board and position the board in a predetermined position;
    multiple work units, each configured to perform work on the board from below the board held by the conveyance device;

a mounting section configured to mount in an exchangeable manner one of the multiple work units to perform the work on the board from below; and a unit moving device configured to move the mounting section in three axes to position the one of the multiple work units at a predetermined position below the board held by the conveyance device, wherein the mounting section includes a placing table on which a lower surface of the one of the multiple work units is placed, wherein a positioning pin is provided on one of an upper surface of the placing table and the lower surface of each of the multiple work units, and wherein a hole portion into which the positioning pin is to be fitted is formed on an other of the upper surface of the placing table and the lower surface of each of the multiple work units.

6. The substrate work machine according to claim 5, wherein the unit moving device includes an X-direction shifting device movable in an X-axis, a Y-direction shifting device movable in a Y-axis, a Z-direction shifting device movable in a Z-axis, and a turn device rotatable around the Z-axis.

7. The substrate work machine according to claim 6, wherein the mounting section is mounted to an upper surface of the turn device.

\* \* \* \* \*